United States Patent
Yu et al.

(10) Patent No.: US 10,651,675 B2
(45) Date of Patent: May 12, 2020

(54) PACKAGED SEMICONDUCTOR DEVICES WITH WIRELESS CHARGING MEANS

(71) Applicant: Taiwan Semiconductor Manufacturing Co., Ltd., Hsinchu (TW)

(72) Inventors: Chen-Hua Yu, Hsinchu (TW); Hao-Yi Tsai, Hsinchu (TW); Tzu-Sung Huang, Tainan (TW); Ming-Hung Tseng, Toufen Township (TW); Hung-Yi Kuo, Taipei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/132,688

(22) Filed: Sep. 17, 2018

(65) Prior Publication Data
US 2019/0020212 A1  Jan. 17, 2019

Related U.S. Application Data

(63) Continuation of application No. 15/254,135, filed on Sep. 1, 2016, now Pat. No. 10,097,030.
(Continued)

(51) Int. Cl.
*H01L 23/522* (2006.01)
*H01L 23/64* (2006.01)
*H01L 23/10* (2006.01)
*H02J 7/02* (2016.01)
*H01L 21/3205* (2006.01)
(Continued)

(52) U.S. Cl.
CPC ............ *H02J 7/025* (2013.01); *H01F 27/362* (2013.01); *H01F 38/14* (2013.01); *H01L 21/32051* (2013.01); *H01L 23/10* (2013.01); *H01L 23/3121* (2013.01); *H01L 23/49822* (2013.01); *H01L 23/5227* (2013.01); *H01L 23/5389* (2013.01); *H01L 23/645* (2013.01); *H02J 7/0042* (2013.01); *H02J 50/10* (2016.02); *H04B 5/0037* (2013.01); *H04B 5/0075* (2013.01); *H01L 2224/04105* (2013.01); *H01L 2224/19* (2013.01); *H01L 2224/73267* (2013.01); *H01L 2924/19042* (2013.01); *H01L 2924/19105* (2013.01)

(58) Field of Classification Search
CPC ... H01L 23/5227; H01L 23/645; H01L 28/10; H01L 2924/19042
USPC ........................................................ 257/531
See application file for complete search history.

(56) References Cited

U.S. PATENT DOCUMENTS 8,987,059 B2   3/2015 Liang et al.
9,040,334 B2   5/2015 Chu et al.
(Continued)

*Primary Examiner* — Matthew E Warren
(74) *Attorney, Agent, or Firm* — McClure, Qualey & Rodack, LLP

(57) ABSTRACT

A semiconductor device package is provided, including a semiconductor device, a magnetic flux generation unit, a molding material, and a conductive slot. The magnetic flux generation unit is surrounding an axis and configured to produce magnetic flux passes through the magnetic flux generation unit. The molding material is surrounding the semiconductor device and the magnetic flux generation unit. The conductive slot is positioned over the molding material, wherein an opening is formed on the conductive slot, and the axis passes through the opening.

20 Claims, 8 Drawing Sheets

Related U.S. Application Data

(60) Provisional application No. 62/329,224, filed on Apr. 29, 2016.

(51) Int. Cl.

| | | |
|---|---|---|
| *H01L 23/31* | (2006.01) | |
| *H01L 23/498* | (2006.01) | |
| *H01L 23/538* | (2006.01) | |
| *H02J 7/00* | (2006.01) | |
| *H02J 50/10* | (2016.01) | |
| *H04B 5/00* | (2006.01) | |
| *H01F 27/36* | (2006.01) | |
| *H01F 38/14* | (2006.01) | |

(56) References Cited

U.S. PATENT DOCUMENTS

| | | |
|---|---|---|
| 9,065,358 B2 | 6/2015 | Tsai et al. |
| 9,085,455 B2 | 7/2015 | Cheng et al. |
| 9,085,456 B2 | 7/2015 | Tsai et al. |
| 9,122,827 B2 | 9/2015 | Chen et al. |
| 9,133,017 B2 | 9/2015 | Liang et al. |
| 9,138,994 B2 | 9/2015 | Peng et al. |
| 9,139,420 B2 | 9/2015 | Chang et al. |
| 9,139,423 B2 | 9/2015 | Chien et al. |
| 9,181,083 B2 | 11/2015 | Tsai et al. |
| 9,187,317 B2 | 11/2015 | Cheng et al. |
| 9,233,839 B2 | 1/2016 | Liu et al. |
| 9,236,877 B2 | 1/2016 | Peng et al. |
| 9,238,581 B2 | 1/2016 | Wu et al. |
| 2008/0149381 A1 | 6/2008 | Kawagishi et al. |
| 2011/0285215 A1 | 11/2011 | Hatase |
| 2014/0287548 A1 | 9/2014 | Lin et al. |
| 2014/0306791 A1 | 10/2014 | Kanazawa et al. |
| 2014/0346635 A1 | 11/2014 | Kawahara et al. |
| 2015/0137303 A1 | 5/2015 | Chou et al. |
| 2015/0175405 A1 | 6/2015 | Cheng |
| 2015/0175407 A1 | 6/2015 | Cheng et al. |
| 2015/0196912 A1 | 7/2015 | Tsai et al. |
| 2015/0256228 A1* | 9/2015 | Goma ............... H01Q 7/00 307/104 |
| 2015/0294781 A1* | 10/2015 | Yosui ............. H01F 27/2804 343/850 |
| 2017/0040663 A1* | 2/2017 | Ito ................. H01Q 7/00 |
| 2017/0171979 A1* | 6/2017 | Wang ............ H01F 27/2804 |
| 2018/0330870 A1* | 11/2018 | Sakai ............. H05K 3/284 |

\* cited by examiner

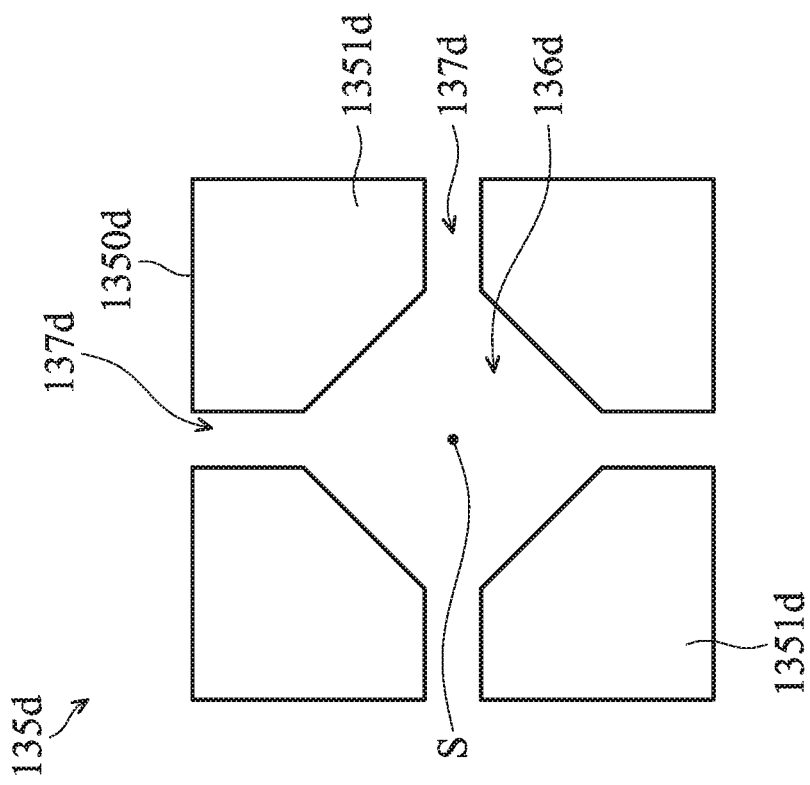
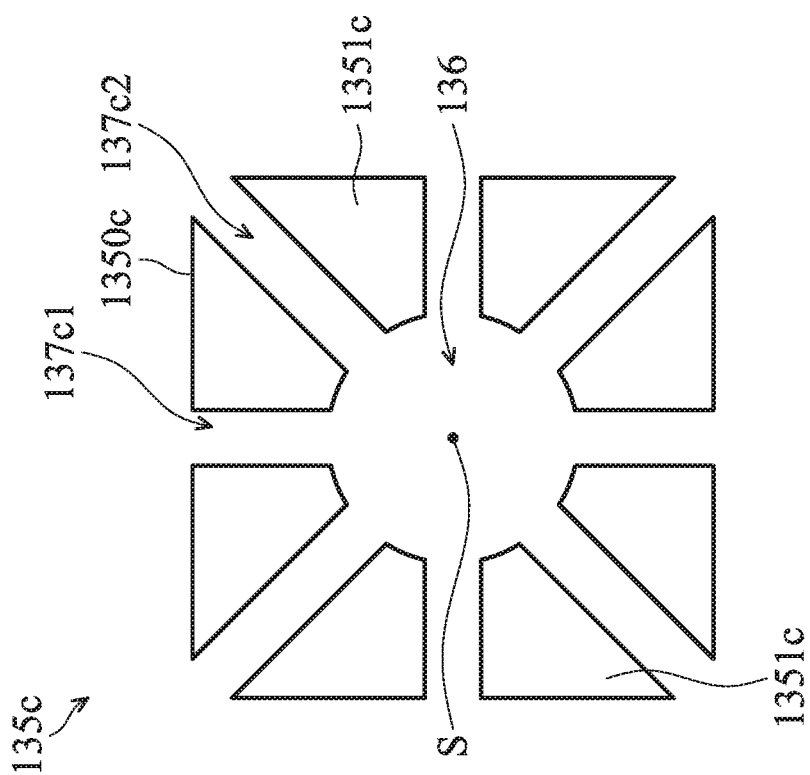
FIG. 6
FIG. 5 ures of the subject matter provided. Specific examples of
PACKAGED SEMICONDUCTOR DEVICES WITH WIRELESS CHARGING MEANS

PRIORITY CLAIM AND CROSS-REFERENCE

This application is a continuation of application Ser. No. 15/254,135, filed on Sep. 1, 2016, now U.S. Pat. No. 10,097,030, which claims the benefit of U.S. Provisional Application No. 62/329,224, filed on Apr. 29, 2016, the entirety of which is incorporated by reference herein.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

When semiconductor devices are used in electronic apparatus, a power supply member is generally connected to the dies for supplying power and may be charged by a wireless charging system. In the wireless charging system, an electromagnetic field is produced in a charging station where energy is transferred to the electronic apparatus. An induction coil in the electronic apparatus takes power from the electromagnetic field and converts it back into electric current to charge the battery.

However, one critique of this method is that the potential for energy loss between the electronic apparatus and the charging station is less efficient. Therefore, a need arises for a method of performing efficient wireless charging.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 5 shows a top view of a conductive metal slot, according to some embodiments of the disclosure.

FIG. 6 shows a top view of a conductive metal slot, according to some embodiments of the disclosure.

DETAILED DESCRIPTION

Figure 1:
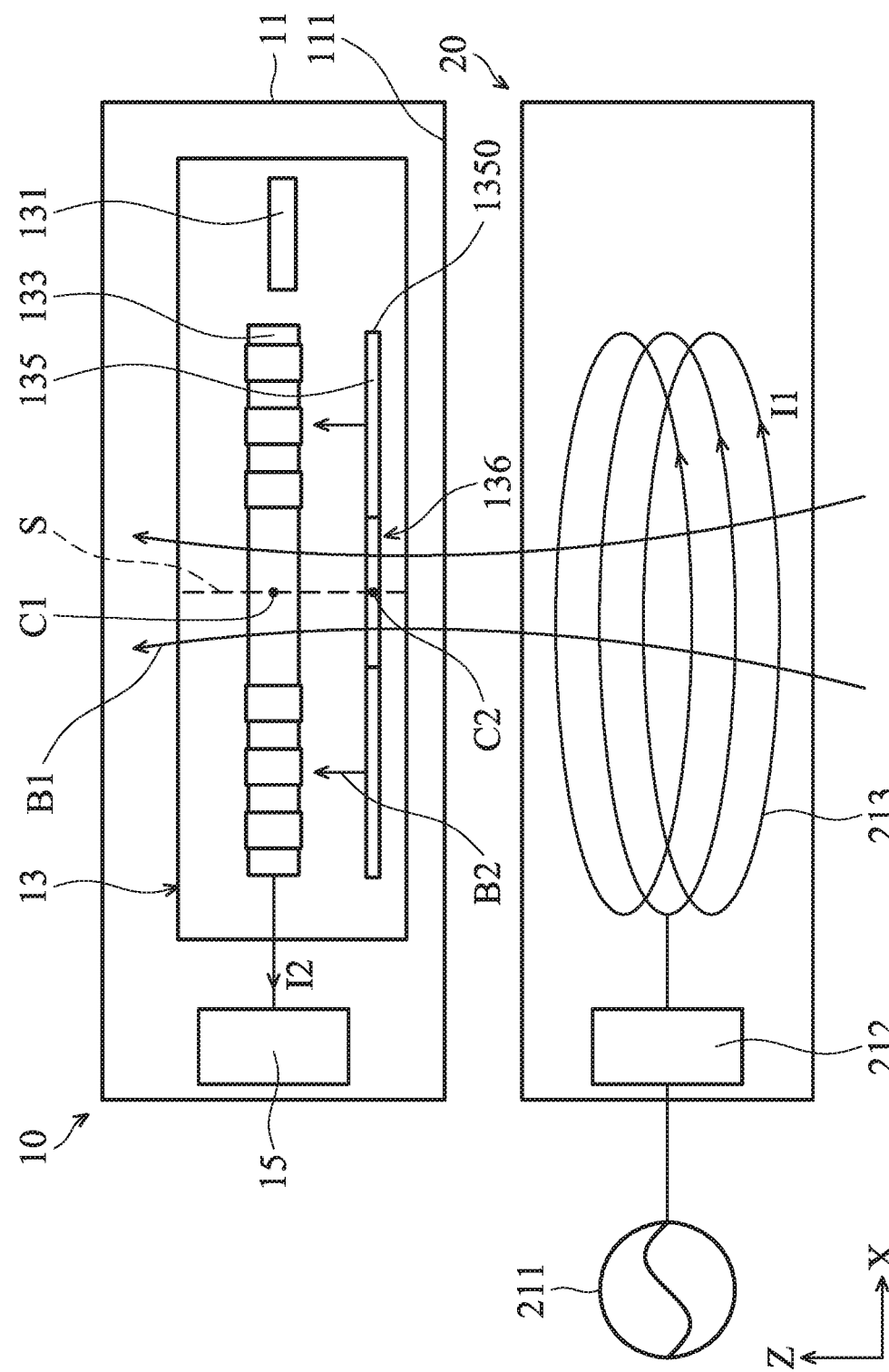
FIG. 1 is a schematic diagram of an electronic apparatus and a charge station, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

FIG. 1 is a schematic diagram of an electronic apparatus 10 and a charge station 20, in accordance with some embodiments. In some embodiments, the electronic apparatus 10, for example, is a personal computer, a cell phone, a digital camera, and other electronic equipment. The charge station 20 is configured to charge a power supply member 15 in the electronic apparatus 10 by wireless (contactless) techniques.

In some embodiments, the charge station 20 is an electromagnetic induction type contactless charging apparatus and includes a transmission circuit 212 that operates by receiving AC power 211 and a primary coil 213 for electromagnetic induction. When the electronic apparatus 10 is positioned at a predetermined location, and the AC power is supplied to the primary coil 213, the power supply member 15 is charged by the electromagnetic induction.

In some embodiments, the electronic apparatus 10 includes a housing 11, a semiconductor device package 13, and a power supply member 15. The elements of the electronic apparatus 10 can be added to or omitted, and the invention should not be limited by the embodiment.

The housing 11 defines a space for receiving the semiconductor device package 13 and the power supply member 15. The housing 11 may be made from a plastic material that is adapted to be molded or cast. The semiconductor device package 13 is electrically connected to the power supply member 15 via a circuit. In some embodiments, the semiconductor device package 13 and the power supply member 15 are disposed on a circuit board (not shown in FIG. 1), and the semiconductor device package 13 is electrically connected to the power supply member 15 via the wiring structure in the circuit board.

In some embodiments, the semiconductor device package 13 is a three-dimensional integrated circuit (3D IC) package which includes one or more devices or semiconductor devices stacked vertically. For example, the semiconductor device package 13 includes a semiconductor device 131, a coil 133, and a conductive metal slot 135.

The semiconductor device 131 may be a die or a package. The semiconductor device 131 may include digital SiP's, radio frequency (RF) SiP's, sensor SiP's, mixed signal SiP's, integrated circuits, drivers, electrostatic discharge (ESD) and/or electromagnetic interference (EMI) protection circuits, direct current (DC)/DC converters, SiP's with chip embedded technology, discrete passive devices, Bluetooth™ modules, television (TV) modules, amplitude and/or frequency modulation (AM and/or FM) modules, global positioning system (GPS) modules, baseband modules, camera modules, cellular radio modules, audio modules, power management modules, central processing unit (CPU) modules, wireless local area network (WLAN) modules, integrated passive device (IPD) modules, IPD network modules, light emitting diode (LED) flash modules, graphics processing unit (GPU) modules, and/or visual processing unit (VPU) modules, as examples. Alternatively, the semiconductor devices 131 may include other types of functions, circuitry, and packages, depending on the end application of the semiconductor device package 13.

The coil 133 causes the electromagnetic induction with the primary coil 113 of the transmitter 110. In some embodiments, the coil 133 is arranged adjacent to the semiconductor device 131. The coil 133 and the semiconductor device 131 are located at two positions that do not overlap each other. The coil 133 may be provided according to a desired pattern, for example, loop-form. The coil 133 may be formed by conductive material, such as copper with a thickness from about 0.070 mm to about 0.105 mm. One example for fabricating the coil 133 is illustrated in the descriptions with respect to FIGS. 7 and 8.

The conductive metal slot 135 is configured to strengthen charging efficiency by shaping the magnetic flux produced by the charge station 20. The conductive metal slot 135 may be made of conductive material which is selected from the group consisting of copper, copper alloys, aluminum, aluminum alloys, silver, silver alloys, gold, gold alloys, and mixtures thereof.

In some embodiments, the conductive metal slot 135 is arranged adjacent to a cover 111 of the housing 11. In addition, the conductive metal slot 135 is positioned between the coil 133 and the cover 111 or the conductive metal slot 135 is positioned between the semiconductor device 131 and the cover 111. In some embodiments, the projection of the conductive metal slot 135 on the cover 111 overlaps a portion of the projection of the coil 133 on the cover 111. Additionally or alternatively, the projection of the conductive metal slot 135 on the cover 111 overlaps a portion of the projection of the semiconductor device 131 on the cover 111.

Figure 2:
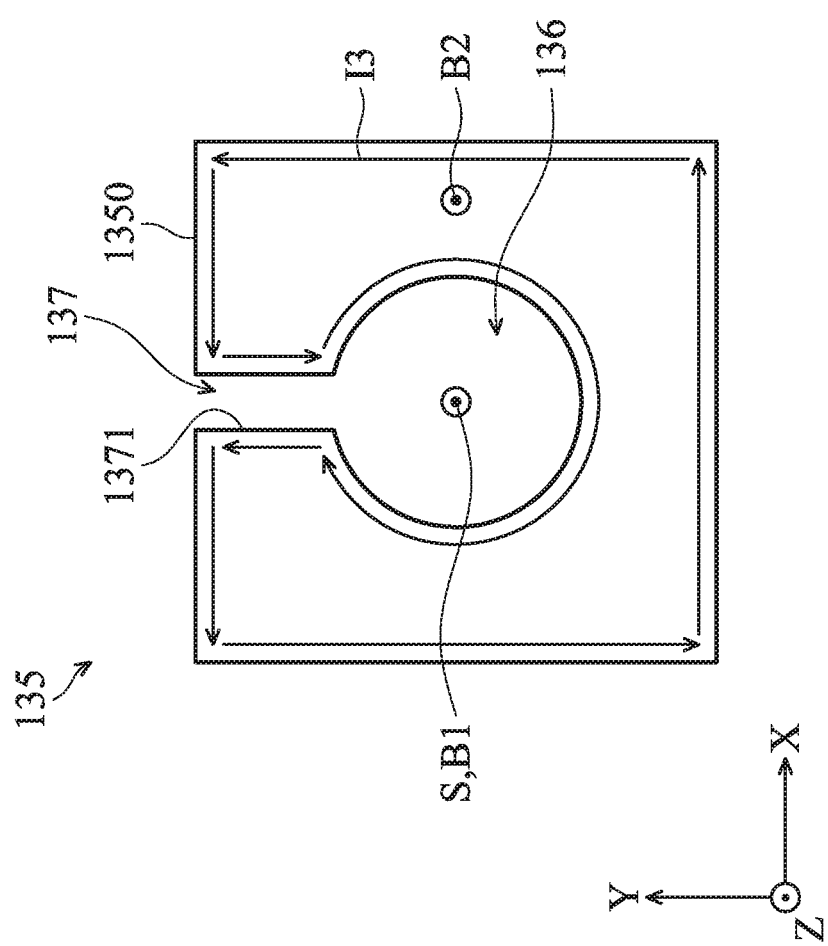
FIG. 2 shows a top view of a conductive metal slot, according to some embodiments of the disclosure.

FIG. 2 shows a top view of the conductive metal slot 135, according to some embodiments of the disclosure. In some embodiments, the conductive metal slot 135 has a rectangular shape, and an opening 136 with circular shape is formed at the center of the conductive metal slot 135. The opening 136 has a round shape. However, it should be appreciated that many variations and modifications can be made to embodiments of the disclosure. The shape of the conductive metal slot 135 and the opening 136 may be circular, rectangular, square, ellipsoidal, or trapezial.

In some embodiments, a channel 137 is formed on the conductive metal slot 135. The channel 137 connects the opening 136 to the outer edge 1350 of the conductive metal slot 135. In some embodiments, the channel 137 extends along a straight line that is perpendicular to the outer edge 1350 of the conductive metal slot 135 and is evenly distributed from radial direction of the opening 136. Namely, the inner edge 1371 of the channel 137 is perpendicular to the outer edge 1350 of the conductive metal slot 135. However, it should be appreciated that many variations and modifications can be made to embodiments of the disclosure.

In some embodiments, the channel 137 extends along a direction that is inclined to the outer edge 1350 of the conductive metal slot 135. An inclined angle is formed between the inner edge 1371 and the outer edge 1350. The inclined angle may be in a range from 0 degrees to 180 degrees. As shown in FIG. 2, the perimeter of the outer edge 1350 is greater than that of the edge of the opening 136. The ratio of the perimeter of the outer edge 1350 to the perimeter of the edge of the opening 136 is in a range from about 1.27 to about 3.54.

In some embodiments, as shown in FIG. 1, the conductive metal slot 135 and the coil 133 are arranged along an axis S. In some embodiments, the center C2 of the opening 136 coincides with the center C1 of the coil 133, such that most of the magnetic flux which passes through the opening 136 is transmitted to the center of the coil 133. However, it should be appreciated that many variations and modifications can be made to embodiments of the disclosure.

In some embodiments, the center C2 of the opening 136 is misaligned with the center of the coil 133. In some embodiments, the opening 136 is partially covered with the area defined by the innermost edge of the coil 133. In some embodiments, the opening 136 is not partially covered with the area defined by the innermost edge of the coil 133. The area of the opening 136 may be smaller than the area defined by the innermost edge of the coil 133.

As shown in FIG. 1, during the contactless charging process, an electric current I1 is supplied to the charge station 20 to produce magnetic flux B1 from AC power 211. The magnetic flux B1 passes through the opening 136 and blocked by the conductive metal slot 135 due to shielding effect. Afterwards, an electric current I2 is induced by the magnetic flux B1, and the power supply member 15 is charged by the electric current I2.

At the same time, an eddy current I3 is induced in the conductive metal slot 135 and travels through the current path indicated by the arrows shown in FIG. 2. Since the perimeter of the outer edge 1350 is greater than that of the edge of the opening 136, the magnetic flux produced by the electric current that travels around the outer edge 1350 is greater than the magnetic flux produced by the electric current that travels around the opening 136. As a result, another auxiliary magnetic flux B2 is generated by the eddy current I3, and the electric current I2 is increased to improve the charging efficiency.

The configurations of the conductive metal slot 135 should not be limited to the embodiments above. Some exemplary embodiments of the conductive metal slot are described below.

Figure 3:
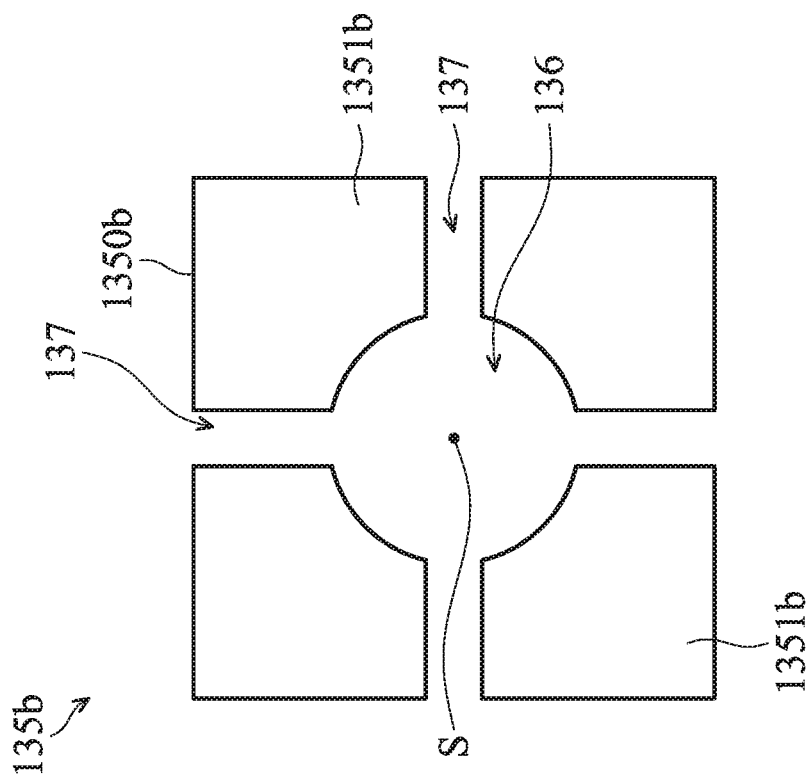
FIG. 3 shows a top view of a conductive metal slot, according to some embodiments of the disclosure.

Referring to FIG. 3, in some embodiments, two channels 137 are formed on the conductive metal slot 135a. The two channels 137a are formed at two opposite sides of the conductive metal slot 135a. Each of the two channels 137a connects the opening 136 to the outer edge 1350a of the conductive metal slot 135a and is evenly distributed from radial direction of the opening 136. The conductive metal slot 135a is equally divided by the two channels 137 to two sub-portions 1351a. The conductive metal slot 135a is formed symmetrical to the axis S.

Figure 4:
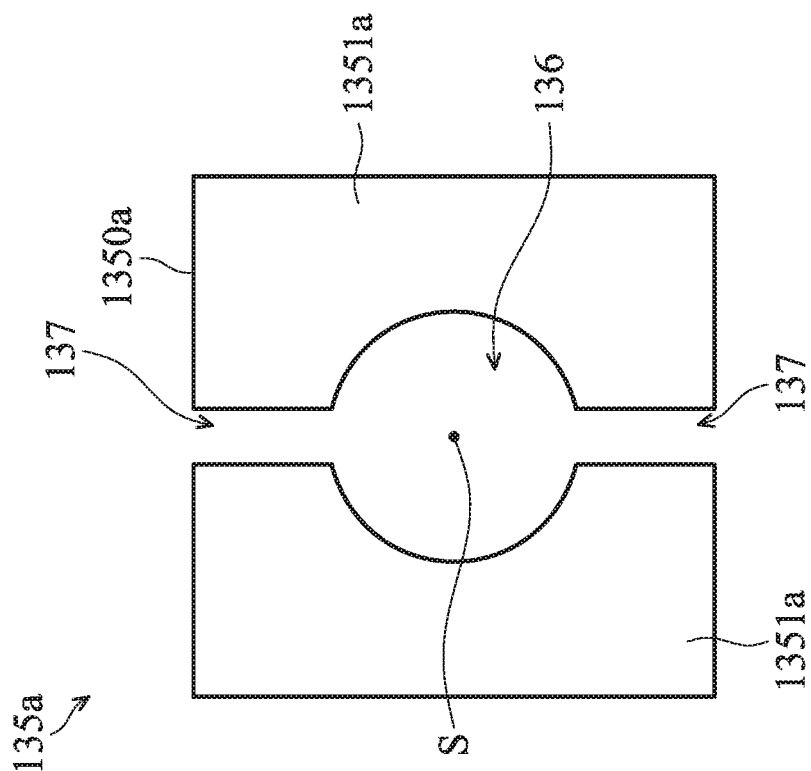
FIG. 4 shows a top view of a conductive metal slot, according to some embodiments of the disclosure.

Referring to FIG. 4, in some embodiments, four channels 137 are formed on the conductive metal slot 135b. The four channels 137 are formed at four sides of the conductive metal slot 135b and each of the four channels 137 connects the opening 136 to the outer edge 1350b of the conductive metal slot 135b. The conductive metal slot 135b is equally divided by the four channels 137 to four sub-portions 1351b. The conductive metal slot 135b is formed symmetrical to the axis S.

Referring to FIG. 5, in some embodiments, four channels 137c1 and four channels 137c2 are formed on the conductive metal slot 135c. The four channels 137c1 are formed at four sides of the conductive metal slot 135c and each of the four channels 137c1 connects the opening 136 to the outer edge 1350c of the conductive metal slot 135c. The four channels 137c2 are formed at four corners of the conductive metal slot 135c, and each of the four channels 137c2 connects the opening 136 to the outer edge 1350c of the conductive metal slot 135c. The channels 137c1 and the channels 137c2 are alternately arranged around the opening 136 and are evenly distributed from radial direction of the opening 136. The conductive metal slot 135c is equally divided by the channels 137c1 and 137c2 to eight sub-portions 1351c. The conductive metal slot 135c is formed symmetrical to the axis S.

Referring to FIG. 6, in some embodiments, a diamond-shaped opening 136d is formed on the conductive metal slot 135d, and the four channels 137d are formed on the conductive metal slot 135d. The four channels 137d are formed at four sides of the conductive metal slot 135d and each of the four channels 137d connects the opening 136d to the outer edge 1350d of the conductive metal slot 135d. The conductive metal slot 135d is equally divided by the four channels 137d to four sub-portions 1351d. The conductive metal slot 135d is formed symmetrical to the axis S.

In some embodiments, the opening formed on the conductive metal slot is closed, and no slot is formed between the opening and the edge of the conductive metal slot. The magnetic flux is shaped by the opening and transmitted to the coil 133.

Figure 7:
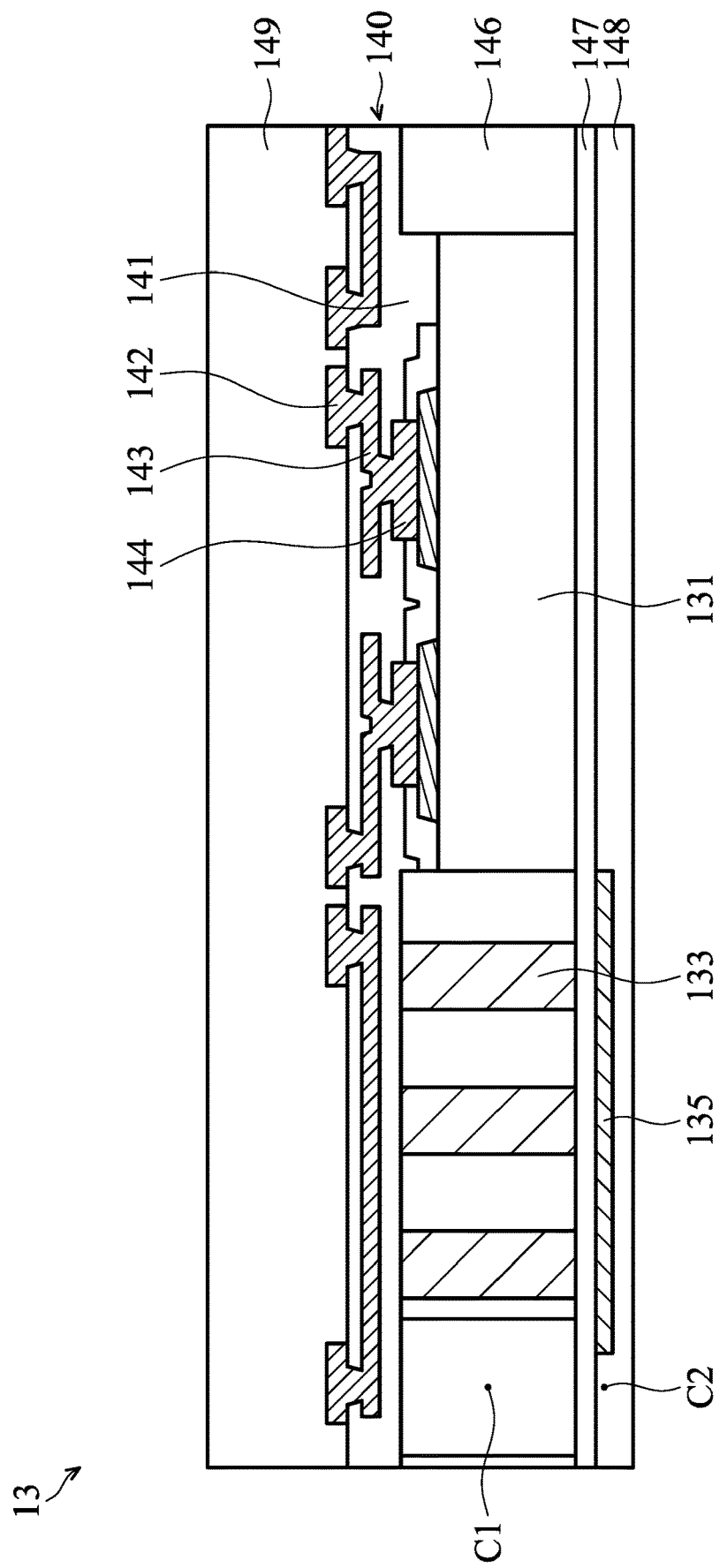
FIG. 7 shows a cross-sectional view of a semiconductor device package, in accordance with some embodiments.
Figure 8:
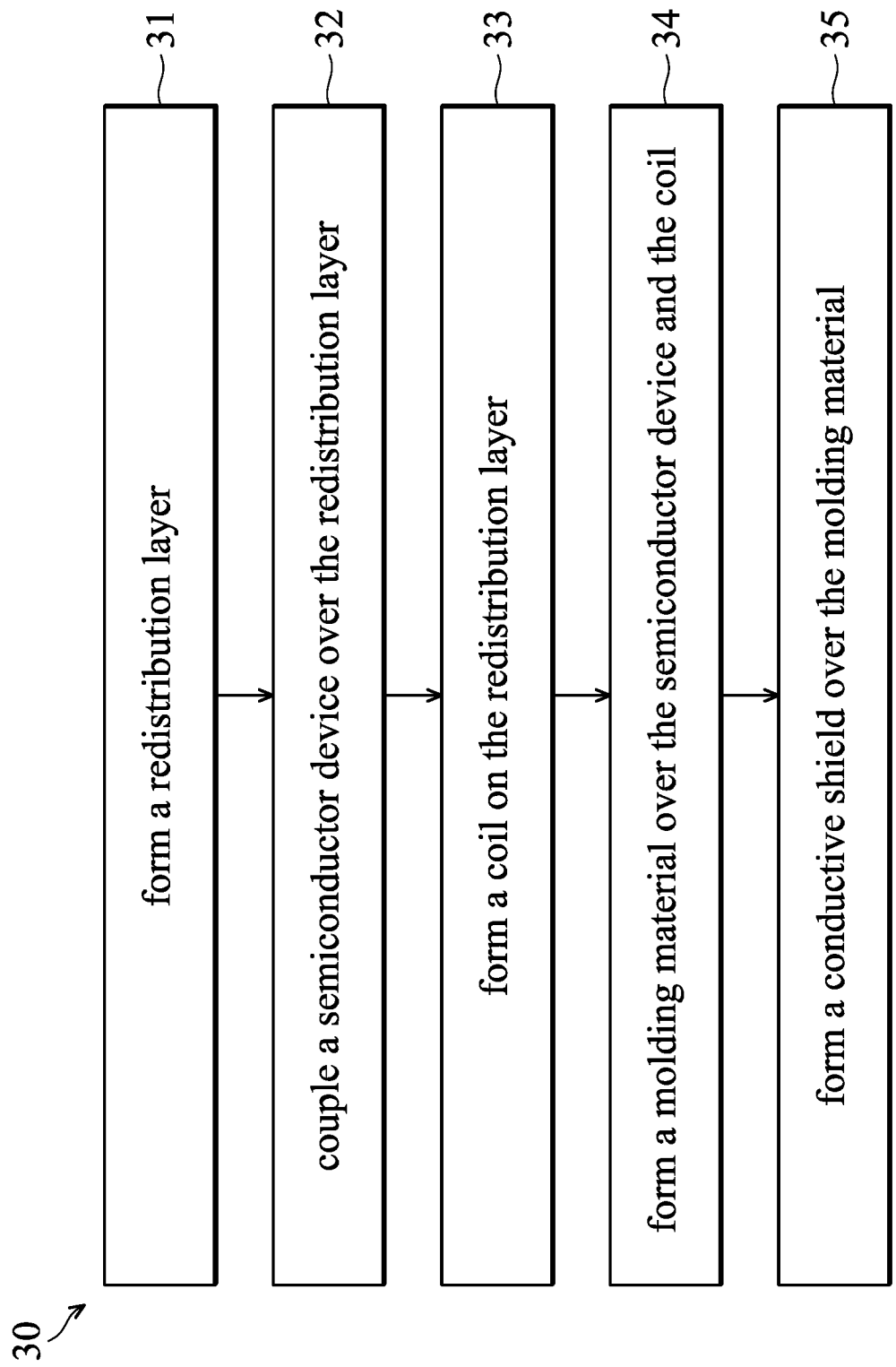
FIG. 8 is a flow chart illustrating a method for fabricating the semiconductor device package 13, in accordance with some embodiments.

FIG. 7 shows a cross-sectional view of the semiconductor device package 13, in accordance with some embodiments. FIG. 8 is a flow chart illustrating a method 30 for fabricating the semiconductor device package 13, in accordance with some embodiments. For illustration, the flow chart will be described in company with the cross-sectional view shown in FIG. 7. Some of the described stages can be replaced or eliminated in different embodiments. Additional features can be added to the semiconductor device structure. Some of the features described below can be replaced or eliminated in different embodiments.

The method 30 begins with an operation 31 in which a redistribution layer 140 is formed. In some embodiments, the redistribution layer 140 is fabricated by integrated Fan-Out (InFO) wafer level packaging technology. Wire structures 143 are formed in insulation materials 141, and a first group of contact pads 142 and a second group of contact pads 144 are respectively formed on a bottom side and a top side of the redistribution layer 140.

Afterwards, the method 30 continues with operation 32, in which the semiconductor device 131 is disposed over the redistribution layer 140. In some embodiments, electrical connectors are formed at the semiconductor device 131. The electrical connectors may include metal pillars. The semiconductor device 131 is coupled to the contact pads 144 via the metal pillars.

In some embodiments, dielectric layers are formed at the surface of the semiconductor device 131, with metal pillars having at least lower portions, or entireties, in dielectric layer. The top surfaces of dielectric layers may also be substantially level with the top ends of metal pillars. Dielectric layers may comprise polyimide, polybenzoxazole (PBO), an oxide layer, a nitride layer, or multi-layers thereof. Alternatively, dielectric layers are not formed.

Afterwards, the method 30 continues with operation 33, in which the coil 133 is formed on the top side of the redistribution layer 140. In some embodiments, the coil 133 may be formed by patterning the conductive layer formed on the top side of the redistribution layer 140 according to a desired pattern (loop form). Alternatively, the coil 133 may be formed within the insulation material 141 of the redistribution layer 140 and the wire structure 143 and the coil 133 are fabricated at the same time.

Afterwards, the method 30 continues with operation 34, in which a molding material 146 is formed over the semiconductor device 131 and the coil 133 is formed over the exposed portion of the redistribution layer 140. The molding material 146 may include compression molding and may comprise epoxy, rubber, or polyimide (PI) in some embodiments, for example, although the molding material 146 may alternatively include other materials. The molding material 146 fills spaces between the semiconductor device 131 and the coil 133. After being dispensed, the molding material 146 is cured. In some embodiments, a planarization process is performed to thin the molding material 40.

Afterwards, the method 30 continues with operation 35, in which the conductive metal slot 135 is formed over the molding material 146. In some embodiments, the redistribution layer 140 and the conductive metal slot 135 are located at two opposite sides of the molding material 146. The redistribution layer 140 and the conductive metal slot 135 are spaced apart by the molding material 146. The conductive metal slot 135 may have an area ranged from 10*10 mm² to about 70*70 mm².

In some embodiments, the top ends of the semiconductor device 131 and the coil 133 are level with the top surface of the molding material 146. In this case, before the process of forming the conductive metal slot 135, a dielectric layer 147 is formed on the top surface of the molding material 146. Afterwards, the conductive metal slot 135 is formed on the dielectric layer 147. However, if the top ends of the semiconductor device 131 and the coil 133 are covered by the molding material 146 and not exposed, the conductive metal slot 135 may be directly formed on the top surface of the molding material 146.

The conductive metal slot 135 may be formed by forming a conductive layer over the molding material 146 or the dielectric layer 147 and patterning the conductive layer according to the pattern. In some embodiments, another dielectric layer 148 is formed over the conductive metal slot 135 to protect it.

In some embodiments, the method 30 further includes forming a ferrite material 149 on a side of the redistribution layer that is opposite to a side where the semiconductor device is connected. The ferrite material 149 have a greater permeability (u'>50) to magnetic fields and is able to concentrate the magnetic field. By placement of the ferrite material 149, the magnetic field is concentrated. In some embodiments, the LM performance (Mutual inductance) is improved by 5 percent or more.

Figure 9:
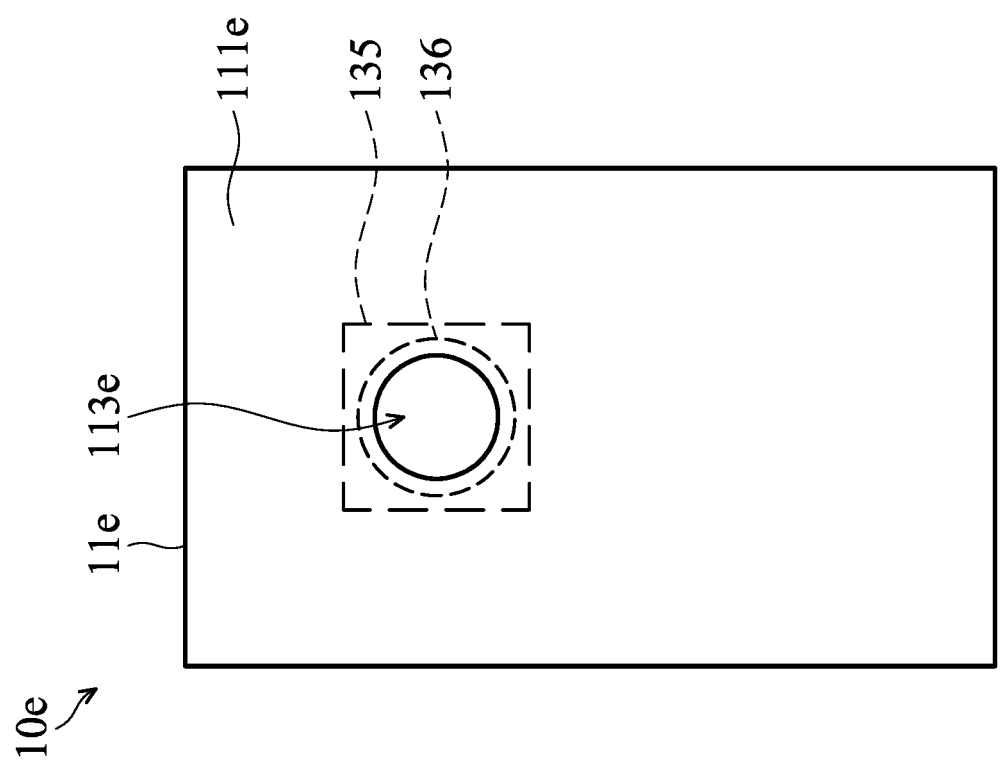
FIG. 9 shows a schematic view of an electronic apparatus, in accordance with some embodiments of the disclosure.

FIG. 9 shows a schematic view of an electronic apparatus 10e, in accordance with some embodiments of the disclosure. In the embodiments of FIG. 9, elements that are similar to those of the embodiments of FIG. 1 are provided with the same reference numbers, and the features thereof are not repeated in the interest of brevity.

In some embodiments, the electronic apparatus 10e includes a housing 11e made of a metallic material. To facilitate wireless charging, a through hole 113e is formed on a cover 111e of the housing 11e. The opening 136 of the conductive metal slot 135 coincides with the center of the through hole 113e. Magnetic flux passes through the through hole 113e and the opening 136 to charge the battery (not shown in FIG. 9) in the housing 11e. The cover 111e may have a width ranged from about 55 mm to about 250 mm, and the cover 111e may have a length ranged from about 130 mm to about 300 mm. The conductive metal slot 135 may be separated from the cover 111e by a distance ranged from 1 mm to 3 mm.

In some embodiments, a camera module (not shown in FIG. 9) is positioned in the housing relative to the through hole 113e. The camera module receives light that passes through the through hole and produces images.

Figure 10:
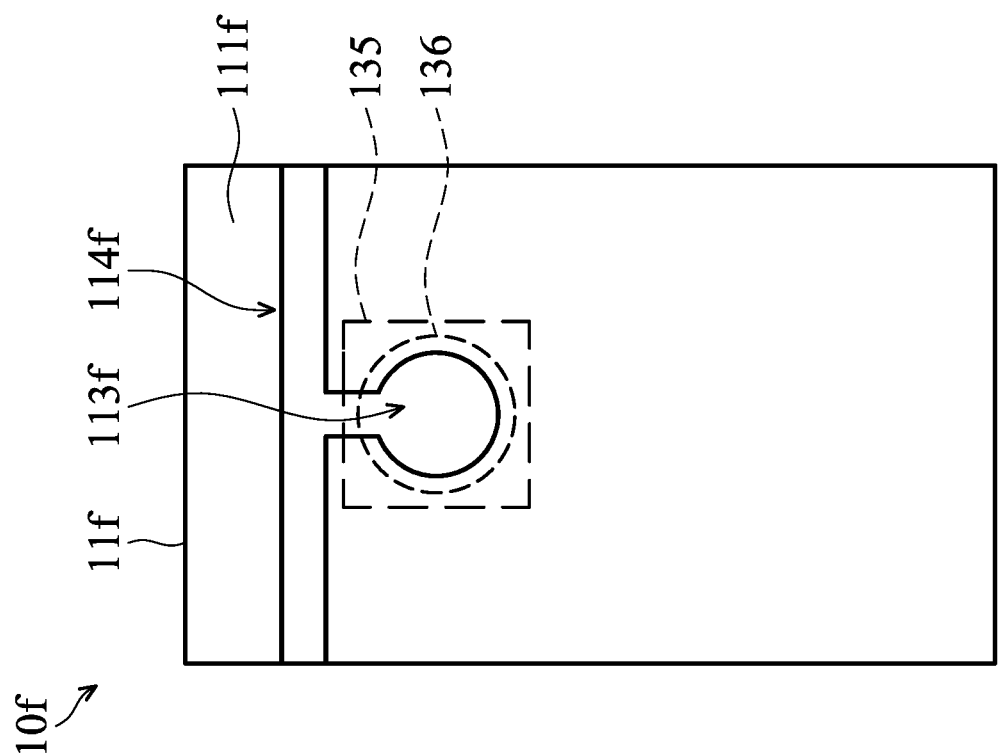
FIG. 10 shows a schematic view of an electronic apparatus, in accordance with some embodiments of the disclosure.

FIG. 10 shows a schematic view of an electronic apparatus 10f, in accordance with some embodiments of the disclosure. In the embodiments of FIG. 10, elements that are similar to those of the embodiments of FIG. 1 are provided with the same reference numbers, and the features thereof are not repeated in the interest of brevity.

In some embodiments, the electronic apparatus 10f includes a housing 11f made of a metallic material. To facilitate wireless charging, a through hole 113f is formed on a cover 111f of the housing 11f. The opening 136 of the conductive metal slot 135 coincides with the center of the through hole 113f. Magnetic flux passes through the through hole 113f and the opening 136 to charge the battery (not shown in FIG. 10) in the housing 11f.

In addition, a channel 114f is formed on the cover 111f and is evenly distributed from the radial direction of the through hole 113f. The channel 114f connects the through hole 113f to the edge of the cover 111f. With the channel 114f, when an eddy current is produced due to a magnetic flux incident during the wireless charging process, the induced eddy current generates another axillary magnetic flux to improve charging efficiency. The cover 111f may have a width ranged from about 55 mm to about 250 mm, and the cover 111f may have a length ranged from about 130 mm to about 300 mm. The conductive metal slot 135 may be separated from the cover 111f by a distance ranged from 1 mm to 3 mm.

In some embodiments, a camera module (not shown in FIG. 9) is positioned in the housing 11f relative to the through hole 113f. The camera module receives light that passes through the through hole and produces images.

Figure 11:
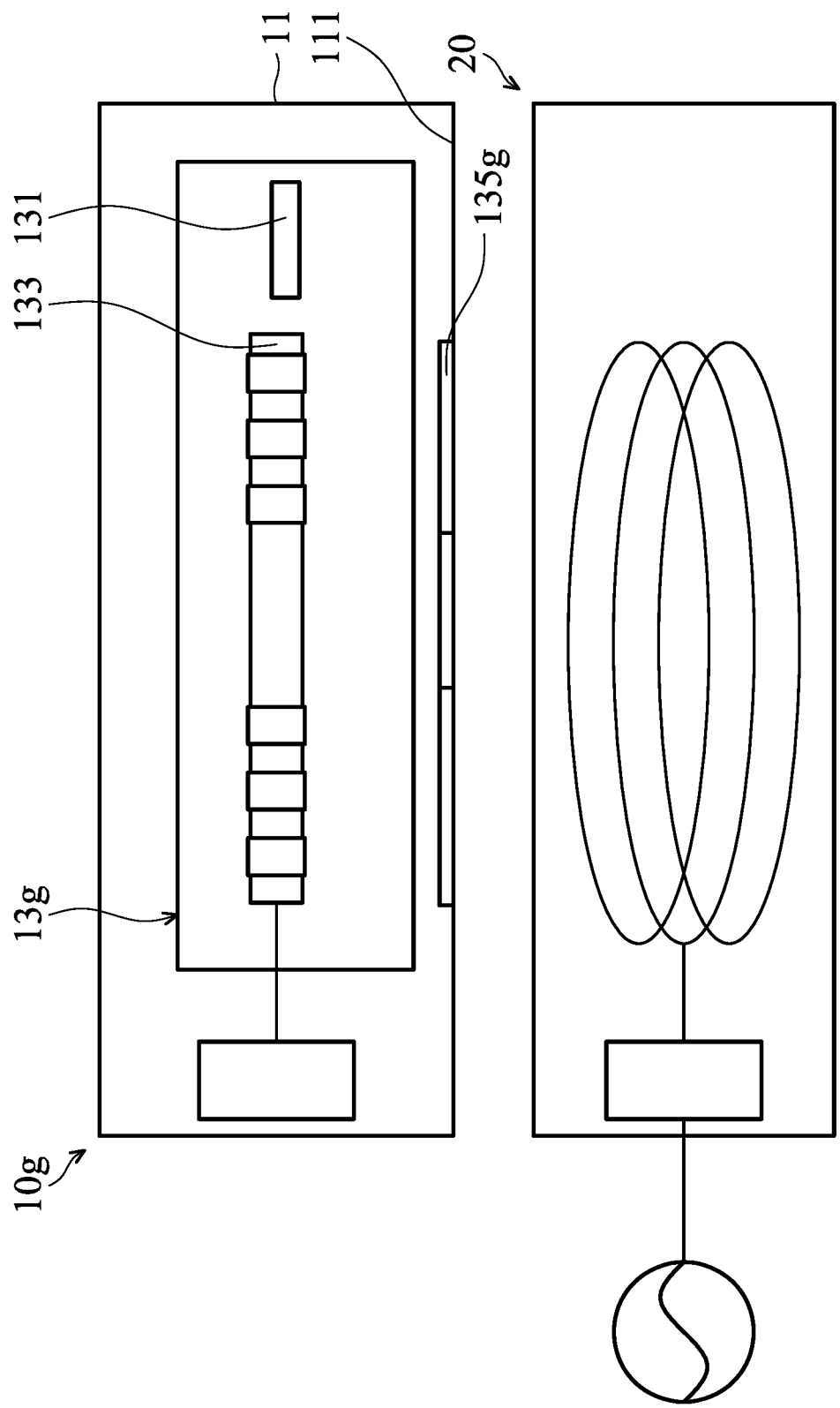
FIG. 11 is a schematic diagram of an electronic apparatus and a charge station, in accordance with some embodiments.

FIG. 11 shows a schematic view of an electronic apparatus 10g and the charge station 20, in accordance with some embodiments of the disclosure. In the embodiments of FIG. 11, elements similar to those of the embodiments of FIG. 1 are provided with the same reference numbers, and the features thereof are not repeated in the interest of brevity. Differences between the electronic apparatus 10 and the electronic apparatus 10g include a conductive metal slot 135g being positioned on the cover 111 of the housing 11. The conductive metal slot 135 separated from the semiconductor device package 13 by a distance. The conductive metal slot 135g may be made with configurations as the conductive metal slot illustrated in any embodiments mentioned above. The conductive metal slot 135g may be connected to the cover 111 via an adhesive material.

Embodiments of an electronic apparatus with a wireless charging function using a conductive metal slot to improve charging efficiency are provided. The charging efficiency is improved by converging the magnetic flux from the charge station via the opening formed on the conductive metal slot. In some embodiments, the LM performance is improved by 30 percent or more. The charging efficiency is also improved by using an auxiliary magnetic flux which is induced by an electric current that flows along the edge of the conductive metal slot. With better charging efficiency, unnecessary power consumption is eliminated, and heat emission generated during the charging process is reduced.

In accordance with some embodiments a semiconductor device package is provided. The semiconductor device package includes a semiconductor device. The semiconductor device package further includes a coil configured to produce electric current as magnetic flux passes through the coil. The semiconductor device package also includes a molding material surrounding the semiconductor device and the coil. Additionally, the semiconductor device package includes a conductive metal slot positioned over the molding material, and an opening is formed on the conductive metal slot.

In accordance with some embodiments an electronic apparatus is provided. The electronic apparatus includes a housing. The electronic apparatus further includes a semiconductor device positioned in the housing. The electronic apparatus also includes a coil positioned in the housing and arranged adjacent to the semiconductor device. The coil is configured to produce electric current as magnetic flux passes through the coil. In addition the electronic apparatus includes a conductive metal slot positioned in the housing and arranged corresponding to the coil. An opening is formed on the conductive metal slot, and at least one channel is formed on the conductive metal slot and connects the opening to the edge of the conductive metal slot.

In accordance with some embodiments method of packaging a semiconductor device is provided. The method includes coupling a semiconductor device and a coil over a redistribution layer. The method further includes forming a molding material over the semiconductor device and the coil. The method also includes forming a conductive metal slot over the molding material. The redistribution layer and the conductive metal slot are located at two sides of the molding material. An opening is formed on the conductive metal slot for allowing magnetic flux to pass through.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor device package, comprising:
   a semiconductor device;
   a coil configured to receive magnetic flux;
   a molding material surrounding the semiconductor device; and
   a conductive slot provided within a dielectric layer that is adjacent to the molding material, wherein the conductive slot has an opening, and the semiconductor device and the coil are disposed on a same side of the dielectric layer.

2. The semiconductor device package as claimed in claim 1, wherein the semiconductor device and the coil are disposed on a same surface of the dielectric layer.

3. The semiconductor device package as claimed in claim 1, wherein the conductive slot and the coil are in alignment with one another.

4. The semiconductor device package as claimed in claim 1, wherein the coil surrounds an axis, the axis extends along a direction that is perpendicular with the conductive slot.

5. The semiconductor device package as claimed in claim 4, wherein the conductive slot is formed symmetrical to the axis.

6. The semiconductor device package as claimed in claim 1, further comprising a redistribution layer electrically connected to the semiconductor device, wherein the conductive slot and the redistribution layer are each arranged at opposite sides of the semiconductor device.

7. The semiconductor device package as claimed in claim 1, wherein a channel is formed on the conductive slot and connects the opening to an edge of the conductive slot, wherein the edge of the conductive slot is distributed by the channel.

8. The semiconductor device package as claimed in claim 1, wherein the opening is formed at the center of the conductive slot.

9. An electronic apparatus, comprising;
   a housing;
   a power source positioned in the housing; and
   a semiconductor device package positioned in the housing, wherein the semiconductor device package includes:
   a molding material surrounding a semiconductor device; and
   a conductive slot provided within a dielectric layer that is adjacent to the molding material, wherein the conductive slot has an opening, and a through hole is formed on the housing, wherein the conductive slot comprises an opening arranged corresponding to the through hole.

10. The electronic apparatus as claimed in claim 9, wherein the semiconductor device package further comprises a molding material surrounding the semiconductor device.

11. The electronic apparatus as claimed in claim 9, wherein the semiconductor device package further comprises a molding material surrounding the semiconductor device, and the conductive slot is spaced apart from the semiconductor device package by a distance.

12. The electronic apparatus as claimed in claim 9, wherein the conductive slot comprises an opening and a plurality of sub-portions, wherein the plurality of sub-portions are arranged surrounding a center of the opening, wherein each two neighboring sub-portions are separated by a channel which connects the opening to the edge of the conductive slot.

13. The electronic apparatus as claimed in claim 9, wherein the conductive slot comprises an opening, and a center of the opening is arranged corresponding to a center of a coil.

14. The electronic apparatus as claimed in claim 9, wherein the housing is made of a metallic material.

15. The electronic apparatus as claimed in claim 9, wherein the housing is made of a plastic material.

16. A semiconductor device package, comprising:
    a semiconductor device;
    a coil configured to receive magnetic flux;
    a molding material surrounding the semiconductor device; and
    a conductive slot provided adjacent to the semiconductor device and within a dielectric layer, wherein the conductive slot has an opening and a channel that extends from an edge of the conductive slot to the opening, and the semiconductor device and the coil are disposed on a same side of the dielectric layer.

17. The semiconductor device package as claimed in claim 16, further comprising another channel extending from another edge of the conductive slot to the opening.

18. The semiconductor device package as claimed in claim 17, wherein the two channels and a center of the opening are aligned along a straight line.

19. The semiconductor device package as claimed in claim 16, further comprising a redistribution layer electrically connected to the semiconductor device, wherein the conductive slot and the redistribution layer are each arranged at opposite sides of the semiconductor device.

20. The semiconductor device package as claimed in claim 16, wherein the conductive slot is arranged corresponding to a center of the coil and the conductive slot and the coil are arranged at opposite sides of the dielectric layer.

* * * * *